United States Patent
De La Cerda

(10) Patent No.: US 11,328,967 B2
(45) Date of Patent: *May 10, 2022

(54) ELECTRICAL DEVICE WITH TEST PADS ENCASED WITHIN THE PACKAGING MATERIAL

(71) Applicant: Micron Technology, Inc., Boise, ID (US)

(72) Inventor: Joseph A. De La Cerda, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/943,960

(22) Filed: Jul. 30, 2020

(65) Prior Publication Data

US 2020/0357708 A1 Nov. 12, 2020

Related U.S. Application Data

(63) Continuation of application No. 16/236,100, filed on Dec. 28, 2018, now Pat. No. 10,734,296.

(51) Int. Cl.
| | |
|---|---|
| H01L 21/66 | (2006.01) |
| H01L 25/065 | (2006.01) |
| G11C 5/04 | (2006.01) |
| H01L 27/115 | (2017.01) |
| H01L 27/108 | (2006.01) |

(52) U.S. Cl.
CPC ........... H01L 22/32 (2013.01); G11C 5/04 (2013.01); H01L 25/0657 (2013.01); H01L 27/10897 (2013.01); H01L 27/115 (2013.01)

(58) Field of Classification Search
CPC ............ H01L 22/32; H01L 25/0657; H01L 27/10897; H01L 27/115; G11C 5/04
USPC ........................................................... 257/48
See application file for complete search history.

(56) References Cited

U.S. PATENT DOCUMENTS

| | | | |
|---|---|---|---|
| 6,373,143 B1 | 4/2002 | Bell | |
| 6,963,150 B2 | 11/2005 | Isoda et al. | |
| 7,511,299 B1 | 3/2009 | Alexander et al. | |
| 10,734,296 B2* | 8/2020 | De La Cerda | ........ H01L 27/115 |
| 2006/0164634 A1 | 7/2006 | Kamins et al. | |
| 2017/0084574 A1 | 3/2017 | Lee | |

OTHER PUBLICATIONS

International Search Report and Written Opinion dated Apr. 23, 2020, on application No. PCT/US2019/068792.

* cited by examiner

Primary Examiner — Tu-Tu V Ho
(74) Attorney, Agent, or Firm — Lowenstein Sandler LLP

(57) ABSTRACT

A substrate is orientated parallel to a plane and includes pads that are located at a bottom surface of the substrate and external to the electrical device. A first integrated circuit die is orientated parallel to the plane and disposed above the substrate in a vertical direction. The first integrated circuit die is electrically coupled to at least some of the pads of the substrate. A packaging material is disposed above the first integrated circuit die around at least a top surface and side surfaces of the first integrated circuit die. Test pads are orientated parallel to the plane and disposed above the first integrated circuit die in the vertical direction. The test pads are electrically coupled to the first integrated circuit die and encased within the packaging material.

20 Claims, 5 Drawing Sheets

ELECTRICAL DEVICE WITH TEST PADS ENCASED WITHIN THE PACKAGING MATERIAL

RELATED APPLICATION

This application is a continuation application of U.S. patent application Ser. No. 16/236,100, filed Dec. 28, 2018, the entire contents of which are hereby incorporated by reference herein.

TECHNICAL FIELD

Embodiments of the disclosure relate generally to electrical devices, and more specifically, relate to an electrical device with test pads encased within the packaging material that is used in memory sub-systems.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure.

DETAILED DESCRIPTION

Figure 1:
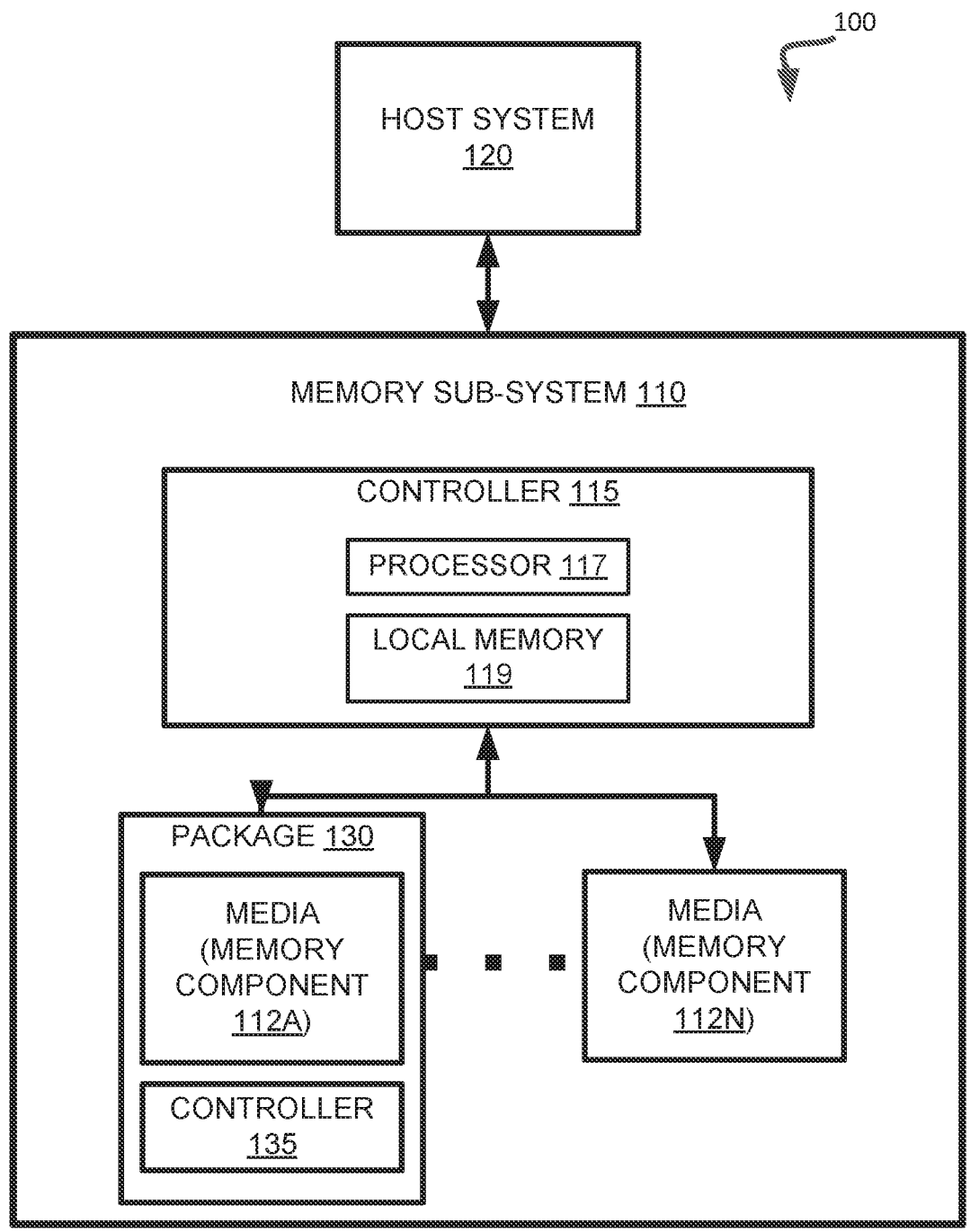
FIG. 1 illustrates an example computing environment that includes a memory sub-system in accordance with some embodiments of the disclosure.

Aspects of the present disclosure are directed to test pads that are encased within the packaging material of an electrical device that is included in a memory sub-system. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. In some embodiments, the memory sub-system can be a hybrid memory/storage sub-system. In general, a host system can utilize a memory sub-system that includes one or more memory components. The host system can provide data to be stored at the memory sub-system and can request data to be retrieved from the memory sub-system.

Electrical devices can include one or more electronic circuits, such as one or more integrated circuit die, that are encased in a package material (also referred to as a "mold compound" herein). The package material can protect the encased electronic circuit from various environmental factors such as moisture, heat, physical contact, and electrostatic discharge, among others. An electrical device can be integrated with other discrete electrical devices using a circuit board. For example, one or more of the electrical devices can be soldered on to the circuit board for purposes of system integration.

In some circumstances it can be desirable to test electrical devices (e.g., diagnostic test) that are soldered to a circuit board. Many conventional electrical device package types have all or some of the electrical contacts located at the bottom surface of the package such that some or all of the electrical contacts are inaccessible to test probes when soldered to a circuit board.

In some conventional systems, an electrical device can be removed from a circuit board in preparation for device testing. For example, in circumstances where the electrical contacts of an electrical device are inaccessible, the electrical device can be removed from the circuit board in order to access one or more electrical contacts and to perform a diagnostic operation on the electrical device. To remove the electrical device from the circuit board, multiple reflows at high temperatures can be performed. A reflow process can refer to a soldering technique in which surface-mount components are held in position on or removed from a circuit board. Performing reflows on an electrical device can damage the electrical device or change the state of the electrical device. For example, a reflow operation can impact the voltage threshold (Vt) of some memory components in the electrical device and can lead to data corruption. Additionally, the reflow operation can damage other discrete electrical devices on the same circuit board. Furthermore, underfill material can be dispersed between the bottom of an electrical device and the circuit board. Underfill can block access to electrical contacts, and removing an electrical device with underfill can damage the underlying circuit board.

Aspects of the disclosure address the above challenges by providing an electrical device with test pads that are encased within the packaging material. In some embodiments, the test pads have surfaces that face towards the top side of the electrical device and are electrically coupled to the underlying integrated circuit die. In some embodiments, the electrical device can be soldered to a circuit board and the electrical contacts on the bottom side of the electrical device can be inaccessible. The test pads can be accessed without reflowing the electrical device and can be accessed while the electrical device is coupled to the circuit board.

In some embodiments, to access the test pads, an etching process can be performed to remove portions of packaging material directly above the test pads. In other embodiments, to access the test pads an alignment guide can be positioned above the electrical device. The alignment guide can be aligned such that open areas in the alignment guide align with the test pads encased within the electrical device. A drill bit can be used in conjunction with the alignment guide to remove the portions of packaging material above the test pads and expose the test pads externally. The exposed test pads can be used to perform test operations on the underlying integrated circuit die.

In some embodiments, the electrical device includes a memory controller and one more memory components. The exposed test pads can be used to access the memory controller and power the one more memory components. A test operation can be performed using probes that are electrically coupled to the exposed test pads to diagnose any problems with the underlying memory components.

Providing an electrical device with test pads that are encased within the packaging material provides electrical access to the underlying electrical circuit without necessitating destructive processes, such as reflow processes, that can damage the functionality of the electrical device, corrupt data stored at the electrical device, damage other discrete components on the same circuit board, damaging the pads underneath the electrical device, or damaging the circuit board. Encasing the test pads in the packaging material protects the test pads from environmental damage and inadvertent electrical contact. Additionally, aspects of the disclosure allow for more accurate diagnostic and other testing to be performed on electrical devices, such as electrical devices that are integrated on a circuit board and returned from the field.

FIG. 1 illustrates an example computing environment 100 that includes a memory sub-system 110 in accordance with some embodiments of the disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as a group of memory cells, wordlines, wordline groups (e.g., multiple wordlines in a group), or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (e.g., processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the disclosure, a memory sub-system 110 cannot include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

In some embodiments, controller 135 and one or more memory components 112A to 112N can be included in a common package, as illustrated by package 130. Controller 135 can be similar to controller 115 and perform some, all, or different operations than controller 115. In some embodiments, controller 115 can interface with controller 135 to control operations with respect to memory component 112A within the package 130. In some embodiments, controller 135 can perform a subset of operations that are performed by controller 115. A package can refer to a case or mold composed of a packaging material that encases on-chip elements, such as one or more integrated circuit die or one or more other electrical circuits within the package. Package 130 can help prevent physical damage and corrosion to the on-chip elements internal to the package 130. The on-chip elements can be coupled to off-chip elements external to the package 130 (e.g. power supply, ground potential, etc.) using electrical contacts, such as pins or terminals, which can physically or electrically couple the package to off-chip elements. In some embodiments, the package 130 can be coupled to a circuit board. The circuit board can refer to a printed circuit board on which one or more electrical devices are connected or interconnected using traces or vias. It can be noted that the controller 135 and memory component 112A is illustrated in a common package for purposed of illustration rather than limitation. In other embodiments, different packages can be used for one or more of controller 135 or memory components 112A to 112N. For example, controller 135 can be in a discrete package, and one or more of memory components 112A to 112N can be in a discrete package.

Figure 2:
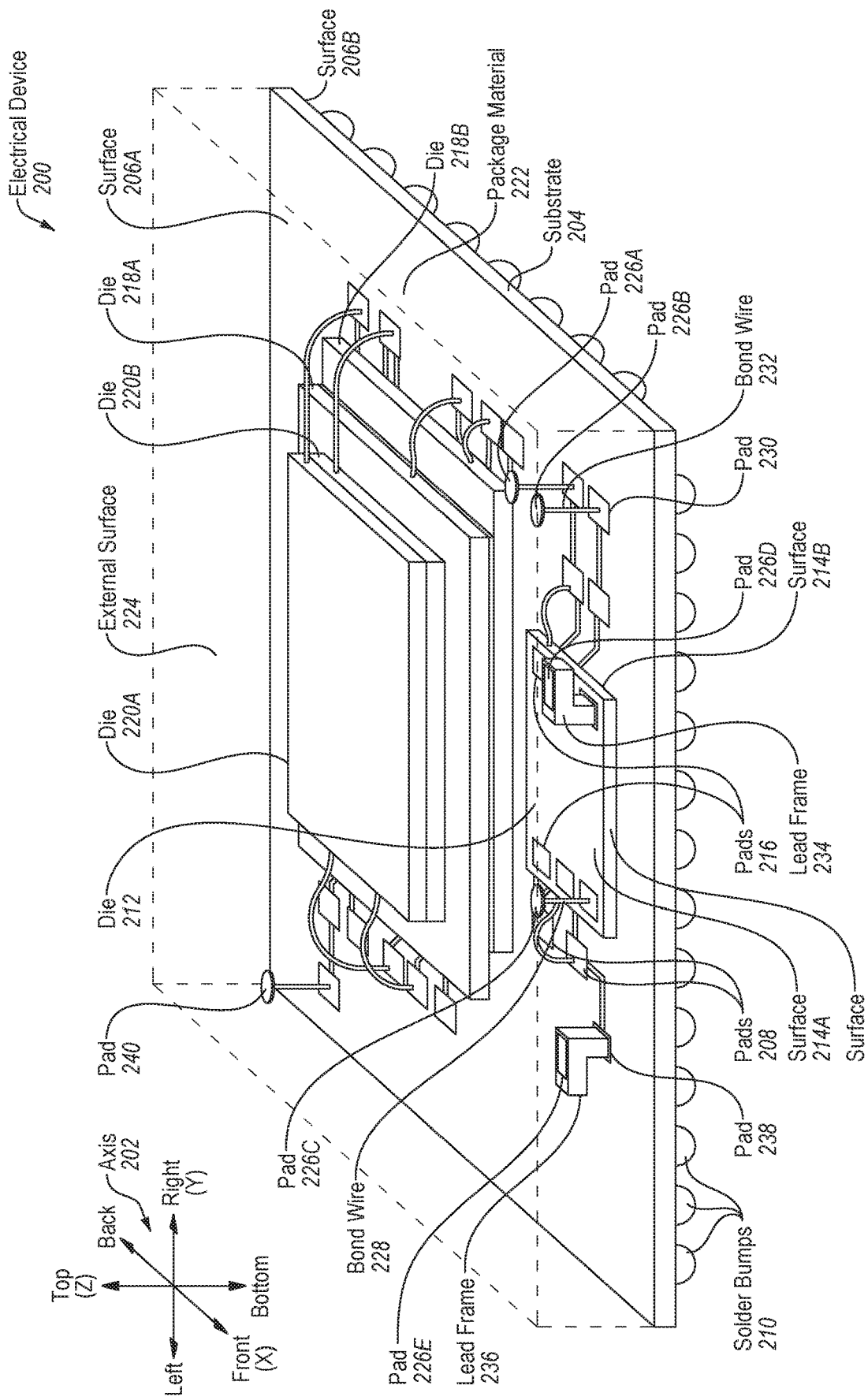
FIG. 2 illustrates an electrical device with test pads, in accordance with some embodiments of the disclosure.

FIG. 2 illustrates an electrical device with test pads, in accordance with some embodiments of the disclosure. Electrical device 200 is described with relative positional relationships, as shown by three-dimensional (3D) axis 202, for purposes of illustration rather than limitation. It can be noted that assigning other relative positional relationships to electrical device 200 is within the scope of the disclosure.

3D axis 202 includes the X-axis, the Y-axis, and the Z-axis. As illustrated, the X-axis points in the direction of the front and the back with respect to electrical device 200. The Y-axis points in the direction of the right and left with respect to electrical device 200. The front, back, right, and left can be also referred to as sides with respect to electrical device 200. The Z-axis (also referred to as "vertical axis" herein) points in the vertical direction of the top and the bottom with respect to electrical device 200.

In embodiments, electrical device 200 can be implemented using a surface-mount technology packaging type for integrated circuits. In embodiments, electrical device 200 is packaged as a ball grid array (BGA), as illustrated. The bottom surface of a BGA device can include an array of solder balls or solder bumps that can be coupled to a circuit board by performing a reflow operation. When soldered to a circuit board, the array of solder bumps are balls underneath the electrical device 200 and some or all the array of solder balls or bumps do not extent from the sides (a plane defined by the sides) of the electrical device 200, which makes the aforementioned solder bumps or balls inaccessible. The electrical device 200 is illustrated having a BGA packaging type for purposes of illustration, rather than limitation.

In other embodiments, aspects of the disclosure can be applied any different package types, such as quad-flat no-leads (QFN), dual-flat no-leads (DFN), or package on package (PoP) package types. QFN and DFN package types have external electrical contacts that are on the bottom side of the electrical device. PoP package types can vertically combine two packages. In some embodiments, the bottom package type of the PoP package is a BGA package type. As noted above, aspects of the disclosure can be applied to any package type. In some embodiments, aspects of the disclosure can have greater applicability for package types where one or more of the electrical contacts are at the bottom side of the package and are difficult to access without removing the electrical device from the circuit board.

In embodiments, electrical device 200 includes a substrate 204. The substrate 204 is orientated parallel to the X-Y plane (e.g. first plane). The substrate includes a top surface 206A and a bottom surface 206B. The bottom surface 206B includes a first group of pads (not shown). The top surface 206A of substrate 204 includes a second group of pads 208. Pads (also referred to as "contact pads" or "bond pads" herein) can refer to designated surface area that allows for electrical coupling. A pad can be composed of a conductive material that allows for soldering. For example, a pad can include a small surface of copper that allows for the physical coupling of solder material. It can be noted that some pads of electrical device 200 are illustrated, but not labeled, but can be considered pads of electrical device 200.

In some embodiments, the first group of pads at the bottom surface 206B of the substrate 204 are electrically coupled to at least some pads of the second group of pads 208 on the top surface 206A of the substrate 204. For example, in a BGA package type, routing vias can be used to electrically couple the first group of pads at the bottom surface 206B of the substrate 204 to at least some pads of the second group of pads 208 on the top surface 206A of the substrate 204. In some embodiments, a group of solder bumps 210 composed of a solder material (e.g., lead, tin, alloys of the aforementioned, etc.) are coupled to the first group of pads at the bottom surface 206B of the substrate 204.

In other package types, substrate 204 can be configured differently than a BGA package type. For example, a QFN package type can have a substrate that includes one or more lead frames, or a die paddle, or both. In one embodiment using a QFN package type, the integrated circuit die can be mounted above the die paddle and pads of the integrated circuit die can be coupled to the top surface of the lead frames (e.g., second group of pads) using bond wire. The bottom surface of the lead frames (e.g., first group of pads) can be exposed external to the QFN package. A lead frame can be a conductive material that is used to carry an electric signal. Wire bonding can be a process of making interconnections, such as interconnections between an integrated circuit die and another conductor. Wire bonding can be used a bond wire that is a thin conductive wire. Bond wire material can include, but is not limited to, aluminum, copper, silver, palladium, or gold or combination thereof. In one embodiment using a QFN package type, a flip-chip (e.g., where the pads of an integrated circuit face the lead frames) can be mounted on the lead frames without bond wire.

In some embodiments, electrical device 200 includes an integrated circuit die 212 orientated parallel to the X-Y plane and disposed above the substrate 204 in the vertical direction. In some embodiments, an integrated circuit die, such as integrated circuit die 212, can include a top surface, a bottom surface and multiple side surfaces (e.g., four side surfaces). For example, integrated circuit die 212 includes top surface 214A, bottom surface 214B, and side surfaces 214C. In some embodiments, the integrated circuit die, such as integrated circuit die 212, includes one or more pads (e.g., third group of pads). For example, integrated circuit die 212 include pads 216. In some embodiments, pads 216 of integrated circuit die 212 can be electrically coupled to at least some of the second group of pads 208 at the top surface 206A of substrate 204. For example, pads 216 of integrated circuit die 212 can be located at the top surface 214A of integrated circuit die 212 and wire bonded to at least some of the pads 208 of substrate 204. In some embodiments, one or more of integrated circuit die of electrical device 200 can be a flip-chip where the pads of the integrated circuit die are located on the bottom surface of the integrated circuit die (e.g., the integrated circuit die is flipped over) with respect to the electrical device 200.

In some embodiments, electrical device 200 can include one or more integrated circuit die. In some embodiments where the electrical device 200 includes multiple integrated circuit die, the electrical device 200 can be configured as a multi-die stack (e.g., multiple integrated circuit die stacked on one another in the vertical direction), or multi-die on the substrate (e.g., multiple integrated circuit die above different portions of the substrate), or a combination of both (as illustrated). As noted above, one or more of the multiple integrated circuit die can be configures as a flip-chip or wire bonded integrated circuit die.

For example, integrated circuit die 218A and 218B are stacked upon one another. Integrated circuit die 220A and 220B are stacked on one another and on integrated circuit die 218A and 218B. Integrated circuit die 212 is adjacent to and located above a different portion of substrate 204 than integrated circuit die 218A, 218B. 220A, and 220B. In some embodiments, integrated circuit die 212 is stacked above another integrated circuit die (e.g., integrated circuit die 218A, 218B. 220A, or 220B) such that the bottom surface 214B of integrated circuit die 212 is above a top surface of the other integrated circuit die.

In some embodiments, integrated circuit die 212 is a controller, such as controller 135 of FIG. 1. In some embodiments, integrated circuit die 218A, 218B. 220A, and 220B are memory components, such as memory components 112A to 112N of FIG. 1. For instance, integrated circuit die 220A and 220B can be volatile memory (e.g., DRAM) and integrated circuit die 218A and 218B can be non-volatile memory (e.g., NAND). In embodiments, integrated circuit die 212 is a controller configured to control operations (e.g., memory operations) at one or more of integrated circuit die 218A, 218B. 220A, or 220B, which are configured as memory components.

In some embodiments, electrical device 200 has a packaging material 222 (also referred to as "mold compound" herein) that is disposed above at least the integrated circuit die 212 such that at least the top surface 214A and side surfaces 214C of the integrated circuit die 212 are surrounded by the packaging material 222. As illustrated, packaging material 222 is also disposed above integrated circuit die 218A, 218B. 220A, and 220B. In embodiments, the packaging material 222 can form one or more external surfaces 224 of the electrical device 200. For example, the packaging material 222 forms four external side surfaces and a top surface of electrical device 200. In some embodiments, the substrate 204 can form the bottom surface of the electrical device 200. In other embodiments, the packaging material 222 can form at least part of the bottom surface of the electrical device 200. In embodiments, the packaging material 222 is disposed such that the first group of pads at the bottom surface 206B of substrate 204 are external to the electrical device 200 and the second group of pads 208 are internal to the electrical device 200. In embodiments, packaging material 222 can include one or more materials such as ceramic materials, epoxy resins, epoxy, silica, phenolic material, among others.

In some embodiments, electrical device 200 includes one or more test pads 226 (e.g., test pads 226 refer to test pads 226A to 226E) orientated parallel to the X-Y plane and disposed above the integrated circuit die 212 in the vertical direction. The one or more test pads 226 are electrically coupled to the integrated circuit die 212. In embodiments, the one more test pads 226 are encased within packaging material 222 such that the one or more test pads 226 are not exposed external to the electrical device 200. In embodiments, test pads 226 have a top surface and a bottom surface. The top surface points in the direction of the top of the electrical device 200.

Test pads 226 are shown in several different configurations for purposes of illustration, rather than limitation. One or more of the different configurations can be implemented in a particular electrical device. In some embodiments, one or more of the test pads 226 have bottom surfaces that are coupled to first ends of respective bond wires. The second ends of the respective bond wires are coupled to the top surface 214A of integrated circuit die 212. For example, test pad 226C has a bottom surface that is coupled to a first end of bond wire 228. The second end of bond wire 228 is coupled to a pad of integrated circuit die 212.

In some embodiments, one or more of test pads 226 are coupled to a fifth group of pads, such as pad 230 at the top surface 206A of the substrate 204. For example, test pad 226B (and test pad 226A) include a bottom surface and a top surface. A first end of a bond wire, such as bond wire 232, is coupled to the bottom surface of test pad 226. The second end of bond wire 232 is coupled to pad 230 at the top surface 206A of substrate 204. The fifth group of pads, such at the top surface 206A of the substrate 204 are electrically coupled to integrated circuit die 212. For example a trace at substrate 204 can connect pad 230 to another pad at substrate 204 that is further coupled to a pad at integrated circuit die 212.

The one or more of test pads 226 can share a pad that is also being wire bonded to the integrated circuit die 212 (not shown). For example, pads 208 point to two pads at the top surface 206A of substrate 204, which are wire bonded to integrated circuit die 212. Pads 208 can also be wire bonded to a test pad (not shown).

In some embodiments, one or more of test pads 226 include a lead frame that is directly coupled to integrated circuit die 212. In some embodiments, the lead frame is disposed above integrated circuit die 212 in the vertical direction. The lead frame, such as lead frame 234, includes a top surface and a bottom surface. In some embodiments, the bottom surface is coupled to a pad at the top surface 214A of integrated circuit die 212. For example, the lead frame 234 can be bonded to the pad at the integrated circuit die 212. The top surface of the lead frame (e.g., pad 226D) can be pointed in the direction of the top of the electrical device 200. In embodiments, the lead fame can be encased within the packaging material 222 such that the lead frame is not exposed external to the electrical device 200.

Furthermore, one or more of test pads 226 can include a lead frame that is coupled to a pad at substrate 204. For example, lead frame 236 is coupled to pad 238 at substrate 204. Pad 238 is coupled to one of the pads 208 at substrate 204, which is coupled to a respective pad 216 at the top surface 214A of integrated circuit die 212. The top surface of pad 226E (e.g., lead frame) can be pointed in the direction of the top of the electrical device 200.

As noted above, in some embodiments, another integrated circuit die (e.g., integrated circuit die 218A, 218B, 220A, or 220B) is orientated parallel to the X-Y plane and is disposed above the substrate 204 in the vertical direction. In some embodiments, the other integrated circuit die also includes pads that are electrically coupled to at least some of the second group of pads 208 at the top surface 206A of the substrate 204. In some embodiments, one or more additional test pads, such as pad 240, are oriented parallel to the X-Y plane and disposed above the other integrated circuit die. The one or more additional test pads can be electrically coupled to the other integrated circuit die and encased within the packaging material 222 such that the one or more additional test pads are not exposed external to the electrical device 200. In embodiments, the additional test pads can have other configurations as described herein.

In some embodiments, the test pads 226 and pad 240 can include 5 or more test pads. For example, integrated circuit die 212 can be a controller. Test pads 226 can be coupled to a power pad, a ground pad, a data input pad, and a data output pad of integrated circuit die 212. In some embodiments, the data input pad and a data output pad of integrated circuit die 212 can correspond to a universal synchronous receiver (Rx) and transmitter (Tx)(UART) input-output terminals, respectively. Integrated circuit die 218B can be a non-volatile memory device and test pad 240 can be coupled to a power pad at integrated circuit die 218B. Integrated circuit die 212 and 218 can share a ground potential so that a single test pad coupled to a ground pad satisfies the ground potential for each integrated circuit die. In other embodiments, any number of test pads can be implemented and can be determined based on application and test requirements.

In some embodiments, at least the top surface of test pads 226 are disposed above integrated circuit die 212 in the vertical direction. In some embodiments, the location of the test pads can vary and be anywhere within the packaging material 222 and face any direction. Test pads 226 are encased within the packaging material 222 such that the removal of a portion of the packaging material 222 above the test pads provides access to the test pads 226 that allows for a test operation (also referred to as a "diagnostic operation" herein) to be performed at the integrated circuit die.

A test operation can test the functionality of integrated circuit die 212 or the functionality of other integrated circuit die that integrated circuit die 212 controls. For example, a test operation can include a testing pattern that corresponds to operations to read or write data to the one or more memory components. The test operation can generate the data to be written to the one or more memory components. The testing pattern can simulate certain operational conditions, such as performing numerous writes to determine whether the memory component can function properly at certain temperatures. The test pattern can be performed utilizing different voltages to determine whether the memory component writes or reads data properly under different voltages.

In some embodiments, packaging material 222 can include a first material and a second material. The first material can be disposed directly above and contact test pads 226 (and test pad 240). The second material can be disposed adjacent to the first material. In some embodiments, an etch process, such as a chemical etch process, can remove the first material at a greater rate than the second material so that the top surface of the test pads 226 is exposed without exposing or damaging the underlying integrated circuit die.

Figure 3:
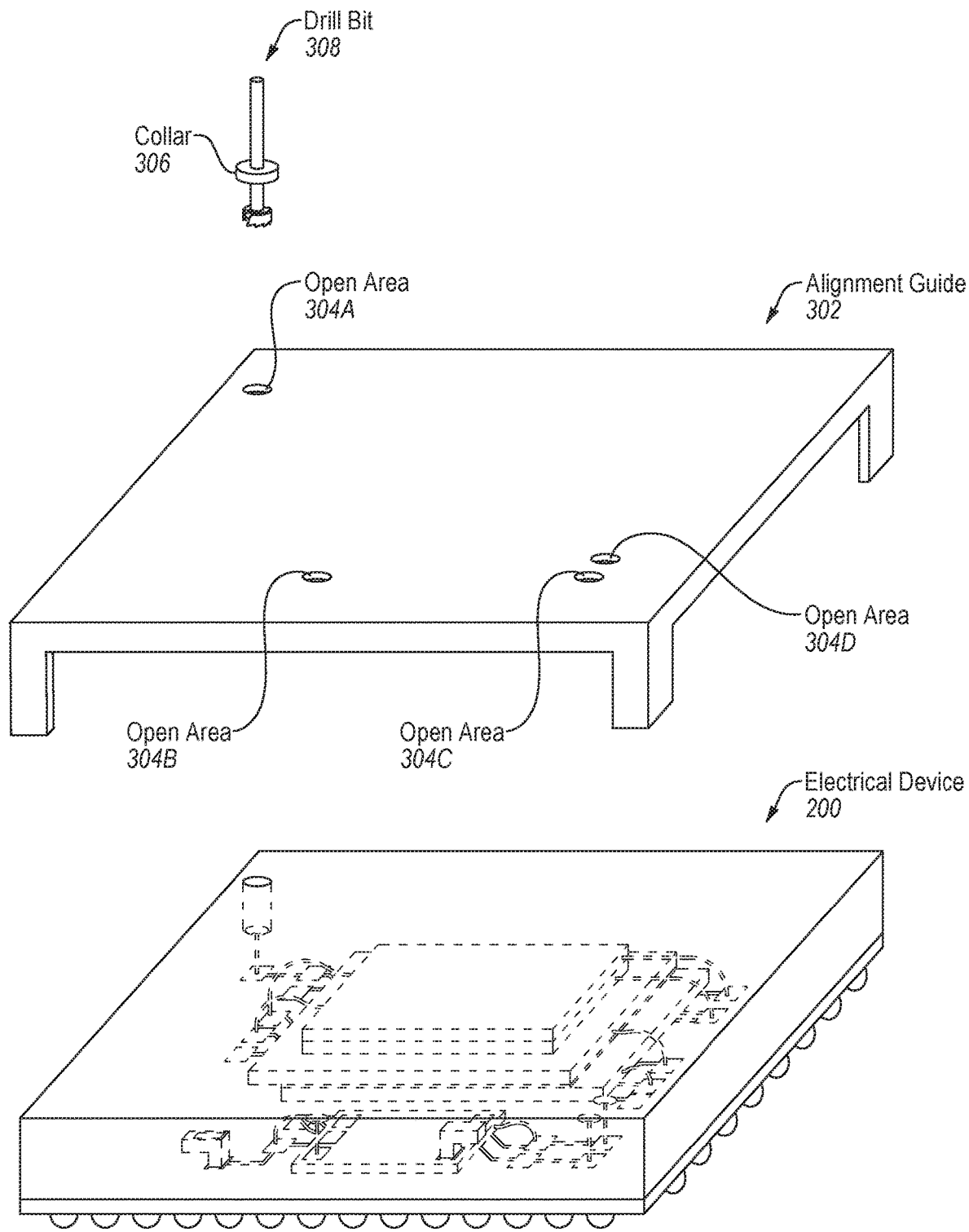
FIG. 3 illustrates a system to access test pads encased within an electrical device, in accordance with some embodiments of the disclosure.

FIG. 3 illustrates a system to access test pads encased within an electrical device, in accordance with some embodiments of the disclosure. Elements of FIG. 2 are used to help illustrate system 300 of FIG. 3. System 300 can be used to remove portions of packaging material 222 on the top side of an electrical device 200 to expose the test pads. In some embodiments, electrical device 200 is coupled to a circuit board and system 300 can be used to expose the test pads of electrical device 200 when the electrical device 200 is coupled to the circuit board.

In some embodiments, system 300 can include alignment guide 302. Alignment guide 302 can help align a drill bit 308 with respect to one or more test pads encased within the electrical device 200. In embodiments, the alignment guide 302 includes one or more open areas, such as open area 304A, 304B, 304C, and 304D (generally referred to as "open areas 304" herein). The open areas 304 can extend from the top surface of the alignment guide 302 through the bottom surface of the alignment guide 302. In some embodiments, different alignment guides can be provided for different electrical devices with different arrangements of test pads.

In embodiments, the alignment guide 302 is positioned above the top side of the electrical device 200 so that the one or more open areas 304 align with respective test pads of electrical device 200 that are encased within electrical device 200. In embodiments, the test pads are directly below the respective open areas 304 in the vertical direction. The depth ($d_{ag}$) between the top surface and bottom surface of alignment guide 302 can have a particular distance. The depth ($d_{tp}$) between the top external surface of the electrical device 200 and the top surface of the test pads can also have the particular distance. Once the alignment guide 302 is positioned above the electrical device 200 the total depth from the top surface of the alignment guide 302 to the top surface of the test pad is represented as the sum of $d_{ag}+d_{tp}$.

In some embodiments, the alignment guide 302 can be secured to the electrical device 200 such that the alignment guide 302 does not move when being used. In some embodiments, the alignment guide 302 can have one or more legs that can be fitted at the corners or sides of electrical device 200 to help secure the alignment guide 302 to the electrical device 200. The one or more legs can establish a friction fit between the alignment guide 302 and the electrical device 200 to help secure the alignment guide 302 to the electrical device 200. In some embodiments, the alignment guide 302 is position above the top side of the electrical device 200 such that the bottom side of alignment guide 302 contacts the top exterior surface of the electrical device 200.

A drill bit 308 can be positioned within a respective open area 304 of the alignment guide 302. In some embodiments, drill bit 308 can have a flat bottom (e.g., flat bottom boring bit). Furthermore, the drill bit 308 can have a collar 306 that controls the drilling depth of the drill bit 308. The collar 306 can be positioned at the drill bit 308 so that the distance from the tip of the drill bit 308 to the bottom surface of the collar 306 equals or is less than the sum of $d_{ag}+d_{tp}$. In some embodiments, the drill bit 308 is used to drill the respective portion of the packaging material 222 in a vertical direction until the collar 306 contacts the top surface of the alignment guide 302.

In some embodiments, the drill bit can remove enough of the packaging material 222 to expose the test pads of electrical device 200. In other embodiments, some parts of the portion of packaging material 222 above the test pads can remain. In some embodiments, an etching process (physical etching or chemical etching) can be used to remove the remaining parts of the portions of the packaging material 222 on the top side of the electrical device 200 to expose the test pads.

Figure 4:
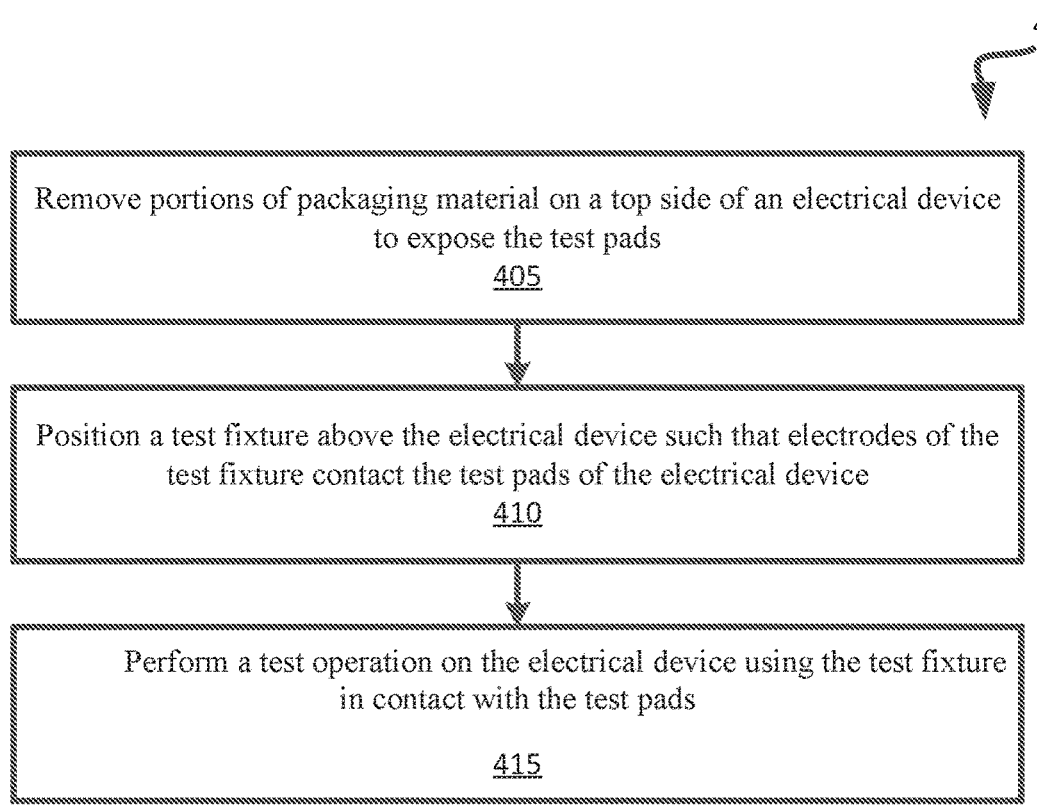
FIG. 4 is a flow diagram of an example method to test an electrical device, in accordance with some embodiments of the disclosure.

FIG. 4 is a flow diagram of an example method 400 to test an electrical device, in accordance with some embodiments of the disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, at least some operations of method 400 is performed by the test pattern component 113 of FIG. 5. Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment. Other operations flows are possible. In some embodiments, different operations can be used. In some embodiments, the same, different, fewer, or more operations can be used. In some embodiments, one or more elements of FIG. 2 or FIG. 3 can be used to perform the operations described herein.

At operation 405, processing logic instructs a test tool to remove portions of the packaging material on a top side of an electrical device to expose one or more test pads. The removal of the portions of the packaging material provides access to the one or more test pads that were previously encased by the packaging material of the electrical device such that the test pads were not exposed external to the electrical device.

In some embodiments, an etching process, such as a chemical etching process, can be used to remove the portions of the packaging material. The packaging material includes a first material and a second material. The portions of the packaging material are composed of the first material, which is different from the second material that is disposed adjacent to the second material. To remove the portions of the packaging material on the top side of the electrical device to expose the test pads, the etch process removes the portions of packaging material on the top side of the electrical device that are directly above the test pads. The etch process removes the first material at a greater rate than the second material so that all or most the first material is removed and the second material remains.

In some embodiments, to remove the portions of the packaging material an alignment guide is positioned above the top side of the electrical device. The alignment guide includes a one or more open areas that extend from a top surface of the alignment guide through a bottom surface of the alignment guide. The one or more open areas are positioned above the test pads. For each of the one or more open areas of the alignment guide, a drill bit is positioned within a respective open area of the alignment guide. In embodiments, the drill bit includes a collar that controls a drilling depth of the drill bit. A drill using the drill bit can drill a respective portion of the packaging material in a vertical direction until the collar contacts the top surface of the alignment guide.

Subsequent to drilling the packaging material of the electrical device, parts of the portions of the packing material can remain. To remove the remaining parts of the portions of the packaging material, an etch process, such as a chemical etch or physical etch, can be performed on the remaining parts of the portions of the packaging material on the top of the electrical device to expose the test pads.

At operation 410, processing logic instructs a test tool to position a test fixture above the electrical device such that electrodes of the test fixture contact the exposed test pads of the electrical device. For example, the test fixture can include multiple connecting devices (e.g., pogo pins or probes) that can establish a connection between the exposed test pads of the electrical device and a testing system. The multiple connecting devices can be held in a frame such that ends of the multiple connecting devices are aligned to make contact with respective exposed test pads. The opposite ends of the connecting devices can be electrically coupled to the testing system. The testing system can be a computer system, such as system 500 of FIG. 5.

At operation 415, processing logic instructs a test tool to perform a test operation on the electrical device using the test fixture that is coupled with the test pads. As noted above, a test operation can include a testing pattern that corresponds to operations to read from or write data to the one or more memory components. In some embodiments, the test pads are coupled to a controller, such as a memory controller, within the electrical device that controls one or more memory components that are also within the electrical device. In some embodiments, the testing pattern can be a diagnostic test that tests the functionality of the memory components to diagnose the cause or causes of failure. In some embodiments, the test operation can be performed by test pattern component 113 of FIG. 5.

Figure 5:
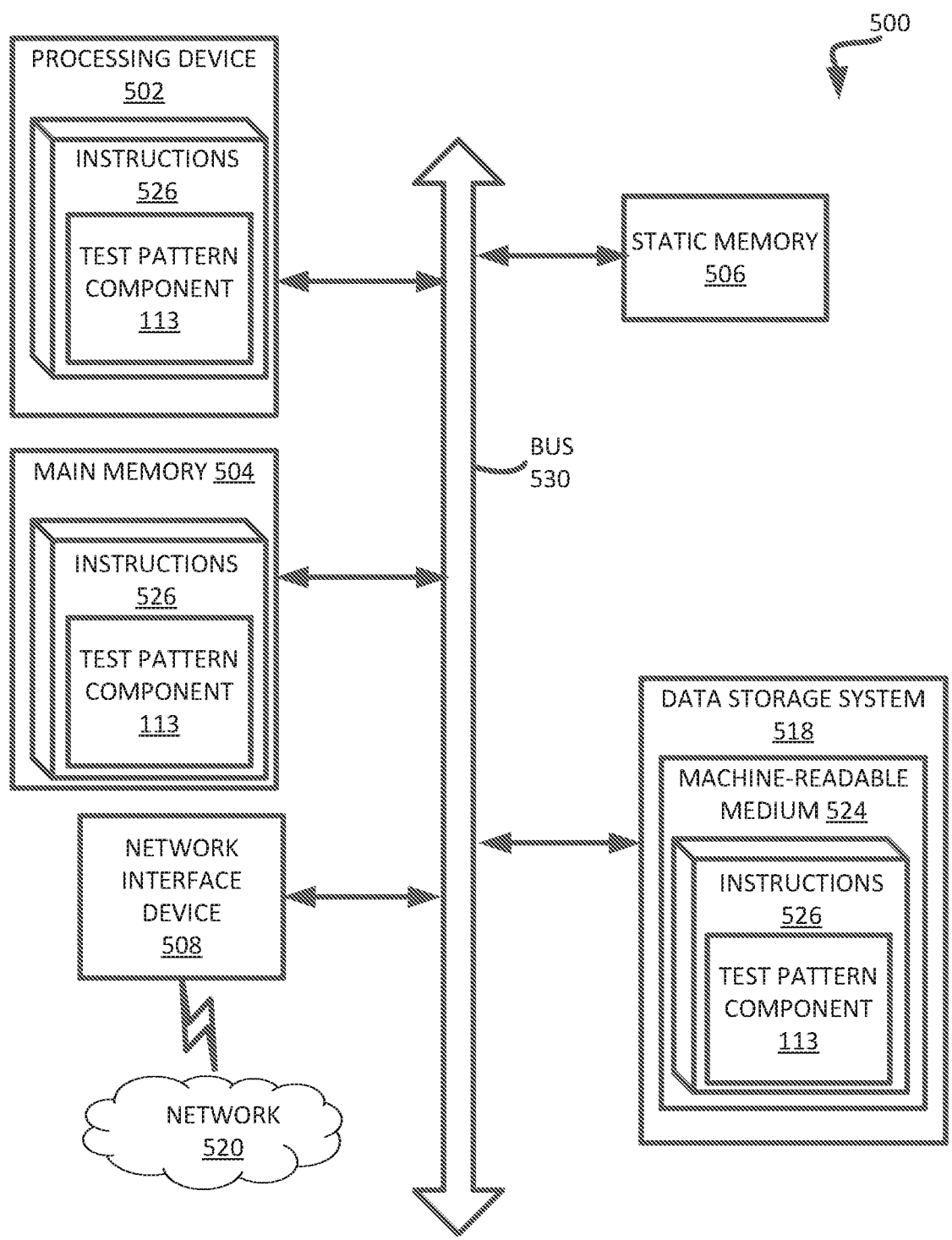
FIG. 5 illustrates an example machine of a computer system within which a set of instructions, for causing the machine to perform any one or more of the methodologies discussed herein, can be executed.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the test pattern component 113). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a non-transitory computer-readable storage medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. In some embodiments, the machine-readable storage medium 524, data storage system 518, and/or main memory 504 can correspond to the memory sub-system 110 of FIG. 1.

In one embodiment, the instructions 526 include instructions to implement functionality corresponding to the test pattern component 113. While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the disclosure. The term "machine-readable storage medium" shall accordingly be taken to include, but not be limited to, solid-state memories, optical media, and magnetic media.

Some portions of the preceding detailed descriptions have been presented in terms of operations and symbolic representations of operations on data bits within a computer memory. These algorithmic descriptions and representations are the ways used by those skilled in the data processing arts to most effectively convey the substance of their work to others skilled in the art. An algorithm or operation is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms, operations, and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An electrical device comprising:
   a substrate orientated parallel to a plane and comprising a first plurality of pads located at a bottom surface of the substrate and external to the electrical device;
   a first integrated circuit die orientated parallel to the plane and disposed above the substrate in a vertical direction, wherein the first integrated circuit die is electrically coupled to at least some of the first plurality of pads of the substrate;
   a packaging material disposed above the first integrated circuit die around at least a top surface and side surfaces of the first integrated circuit die; and
   a plurality of test pads orientated parallel to the plane and disposed above the first integrated circuit die in the vertical direction, wherein the plurality of test pads are electrically coupled to the first integrated circuit die and encased within the packaging material.

2. The electrical device of claim 1, further comprising:
   a first plurality of bond wires comprising first ends coupled to bottom surfaces of the plurality of test pads and second ends coupled to a second plurality of pads at a top surface of the first integrated circuit die.

3. The electrical device of claim 1, further comprising:
   a second plurality of bond wires comprising first ends coupled to bottom surfaces of the plurality of test pads and second ends coupled to a third plurality of pads at a top surface of the substrate, wherein the third plurality of pads electrically coupled to the first integrated circuit die.

4. The electrical device of claim 1, wherein the plurality of test pads comprise a plurality of lead frames disposed above the first integrated circuit die in the vertical direction, wherein the plurality of lead frames comprise bottom surfaces and top surfaces, wherein the bottom surfaces of the plurality of lead frames are coupled to a fourth plurality of pads at a top surface of the first integrated circuit die, wherein the plurality of lead frames are encased within the packaging material such that the plurality of lead frames are not exposed external to the electrical device.

5. The electrical device of claim 1, wherein the plurality of test pads are disposed above the first integrated circuit die in the vertical direction and encased within the packaging material such that removal of a portion of the packaging material above the plurality of test pads provides access to the plurality of test pads to allow for a test operation to be performed at the first integrated circuit die.

6. The electrical device of claim 1, wherein the packaging material disposed above the first integrated circuit die comprises a first material and a second material, wherein the first material is disposed directly above and contacts the plurality of test pads and the second material is disposed adjacent to the first material, wherein an etch process removes the first material at a greater rate than the second material to expose a top surface of the plurality of test pads.

7. The electrical device of claim 1, further comprising:
   a second integrated circuit die orientated parallel to the plane and disposed above the substrate in the vertical direction, wherein the second integrated circuit die comprises a fifth plurality of pads that are electrically coupled to at least some of the first plurality of pads of the substrate.

8. The electrical device of claim 7, further comprising:
   one or more additional test pads orientated parallel to the plane and disposed above the second integrated circuit die in the vertical direction, wherein the one or more additional test pads are electrically coupled to the second integrated circuit die and encased within the packaging material such that the one or more additional test pads are not exposed external to the electrical device.

9. The electrical device of claim 7, wherein the first integrated circuit die is stacked above the second integrated circuit die.

10. The electrical device of claim 7, wherein the first integrated circuit die is located adjacent to the second integrated circuit die.

11. The electrical device of claim 7, wherein the second integrated circuit die comprises a memory component, wherein the first integrated circuit die comprises a controller configured to control operations performed at the memory component.

12. The electrical device of claim 1, further comprising:
    a plurality of solder bumps coupled to the first plurality of pads at the bottom surface of the substrate.

13. A system comprising:
    a circuit board; and
    an electrical device coupled to the circuit board, the electrical device comprising:
    a substrate orientated parallel to a plane and comprising a first plurality of pads located at a bottom surface of the substrate and external to the electrical device;
    a first integrated circuit die orientated parallel to the plane and disposed above the substrate in a vertical direction, wherein the first integrated circuit die is electrically coupled to at least some of the first plurality of pads of the substrate;
a packaging material disposed above the first integrated circuit die around at least a top surface and side surfaces of the first integrated circuit die; and
a plurality of test pads orientated parallel to the plane and disposed above the first integrated circuit die in the vertical direction, wherein the plurality of test pads are electrically coupled to the first integrated circuit die and encased within the packaging material.

14. The system of claim 13, wherein the plurality of test pads are disposed above the first integrated circuit die in the vertical direction and encased within the packaging material such that removal of a portion of the packaging material above the plurality of test pads provides access to the plurality of test pads to allow for a test operation to be performed at the first integrated circuit die without removing the electrical device from the circuit board.

15. The system of claim 13, further comprising:
a second integrated circuit die orientated parallel to the plane and disposed above the substrate in the vertical direction, wherein the second integrated circuit die comprises a fifth plurality of pads that are electrically coupled to at least some of the first plurality of pads of the substrate.

16. The system of claim 15, wherein the second integrated circuit die comprises a memory component, wherein the first integrated circuit die comprises a controller configured to control operations performed at the memory component.

17. A method comprising:
removing portions of packaging material on a top side of an electrical device to expose a plurality of test pads, wherein removal of the portions of the packaging material to provide access to the plurality of test pads that were previously encased by the packaging material of the electrical device, wherein removing the portions of the packaging material on the top side of the electrical device to expose the plurality of test pads further comprises:
positioning an alignment guide above the top side of the electrical device, wherein the alignment guide comprises a plurality of open areas that are positioned above the plurality of test pads; and
for each of the of the plurality of open areas of the alignment guide,
positioning a drill bit within a respective open area of the alignment guide, and
drilling, with the drill bit, a respective portion of the packaging material in a vertical direction.

18. The method of claim 17, comprising:
positioning a test fixture above the electrical device to align a plurality of electrodes of the test fixture to contact the plurality of test pads of the electrical device; and
performing, by a processing device, a test operation on the electrical device using the test fixture in contact with the plurality of test pads.

19. The method of claim 17, wherein removing the portions of the packaging material on the top side of the electrical device to expose the plurality of test pads further comprises:
etching remaining parts of the portions of the packaging material on the top side of the electrical device to expose the plurality of test pads.

20. The method of claim 17, wherein the packaging material comprises a first material and a second material, wherein the portions of the packaging material are composed of the first material that is different from the second material that is disposed adjacent to the second material, and wherein removing the portions of the packaging material on the top side of the electrical device to expose the plurality of test pads further comprises:
performing an etch process to remove the portions of packaging material on the top side of the electrical device, wherein the etch process removes the first material at a greater rate than the second material.

\* \* \* \* \*